United States Patent
Yang

(10) Patent No.: US 7,969,729 B2
(45) Date of Patent: Jun. 28, 2011

(54) ASSEMBLY MECHANISM CAPABLE OF ASSEMBLING AN ELECTRONIC DEVICE QUICKLY AND HOLDING MODULE THEREOF

(75) Inventor: Fu-Jen Yang, Taipei Hsien (TW)

(73) Assignee: Wistron Corporation, Xizhi Dist., New Taipei (TW)

( * ) Notice: Subject to any disclaimer, the term of this patent is extended or adjusted under 35 U.S.C. 154(b) by 481 days.

(21) Appl. No.: 12/268,427

(22) Filed: Nov. 10, 2008

(65) Prior Publication Data

US 2010/0039782 A1 Feb. 18, 2010

(30) Foreign Application Priority Data

Aug. 14, 2008 (TW) .............................. 97214550 U

(51) Int. Cl.
*G06F 1/16* (2006.01)

(52) U.S. Cl. ........... 361/679.54; 439/540.1; 165/104.25; 360/97.01

(58) Field of Classification Search .................. 320/107, 320/112; 439/64, 620.24, 640, 701, 540.1, 439/862; 165/104.34, 104.26, 104.25, 80.2; 360/97.01, 99.01; 361/679.54, 679.48, 679.22, 361/679.37, 679.03, 679.02, 679.4, 679.34, 361/679.55, 679.33, 752; 714/731, 712, 714/742

See application file for complete search history.

(56) References Cited

U.S. PATENT DOCUMENTS

| | | | | |
|---|---|---|---|---|
| 5,613,860 | A * | 3/1997 | Banakis et al. | 439/64 |
| 2004/0252468 | A1* | 12/2004 | Chang | 361/752 |
| 2008/0062663 | A1* | 3/2008 | Tsuo | 361/752 |
| 2009/0268394 | A1* | 10/2009 | Cheng | 361/679.54 |

* cited by examiner

*Primary Examiner* — Hung V Duong

(74) *Attorney, Agent, or Firm* — Winston Hsu; Scott Margo

(57) ABSTRACT

An assembly mechanism includes a case and a fastening structure disposed at a side of the case. The case includes a lower board, a connecting port, a fixing board, and a lateral board. The connecting port and the fixing board are connected to two ends of the lower board respectively. The lateral board is connected to the lower board, the connecting port, and the fixing board. The lateral board is used for containing an electronic device cooperatively with the lower board, the connecting port, and the fixing board. The fastening structure includes a base board and an elastic fixing part. The base board is connected to the connecting port in a rotatable manner. The elastic fixing part is connected to an end of the base board for inserting into a hole of the fixing board when the base board rotates to a first position relative to the connecting port.

15 Claims, 9 Drawing Sheets

US 7,969,729 B2

ASSEMBLY MECHANISM CAPABLE OF ASSEMBLING AN ELECTRONIC DEVICE QUICKLY AND HOLDING MODULE THEREOF

BACKGROUND OF THE INVENTION

1. Field of the Invention

The present invention relates to an assembly mechanism and a holding module thereof, and more specifically, to an assembly mechanism capable of assembling an electronic device quickly and a holding module thereof.

2. Description of the Prior Art

In general, a computer, in which many electronic components (such as a CPU, a motherboard, powers, interface cards, and disk drives) are disposed, has powerful and various functions, like data storing, video display, optical disk recording, and so on. Thus, assembly and disposal of each component inside the computer is time-consuming and strenuous. For example, if a user wants to fix a hard disk drive on a computer case, the user usually needs to insert the hard disk drive into a corresponding disk drive slot of the computer case first. Subsequently, the user needs to align screw holes on a side of the hard disk drive with holes of the disk drive slot. After the user utilizes an auxiliary tool (such as a screwdriver) to drive screws to pass through the corresponding holes of the disk drive slot and lock the screws into the said screw holes respectively, the hard disk drive may be fixed on the computer case. However, if the hard disk drive malfunctions in the future, a subsequent disassembly process for detaching the hard disk drive from the computer case is also complicated. To sum up, the said complicated assembly and disassembly processes may make the screw-locking method in the prior art inconvenient in use. Therefore, how to assemble a hard disk drive on a computer case more easily and quickly should be a concern in computer structural design.

SUMMARY OF THE INVENTION

The present invention provides an assembly mechanism capable of assembling an electronic device quickly comprising a case comprising a lower board for holding an electronic device; a connecting port connected to an end of the lower board and electrically connected to the electronic device; a fixing board connected to an end of the lower board opposite to the connecting port, a hole being formed on the fixing board; a lateral board connected to the lower board, the connecting port, and the fixing board for containing the electronic device cooperatively with the lower board, the connecting port, and the fixing board; and a fastening structure disposed at a side of the case opposite to the lateral board, the fastening structure comprising a base board connected to the connecting port in a rotatable manner; and an elastic fixing part connected to an end of the base board for inserting into a hole of the fixing board when the base board rotates to a first position relative to the connecting port so as to fix the electronic device on the lower board cooperatively with the connecting port, the fixing board, and the lateral board.

The present invention further provides a holding module capable of assembling an electronic device quickly, the holding module comprising a first electronic device having at least one fixing hole; and a first assembly mechanism for fixing the first electronic device, the first assembly mechanism comprising a first case comprising a first lower board for holding the first electronic device; a first connecting port connected to an end of the first lower board and electrically connected to the first electronic device; a first fixing board connected to an end of the first lower board opposite to the first connecting port, a hole being formed on the first fixing board; a first lateral board connected to the first lower board, the first connecting port, and the first fixing board, for containing the first electronic device cooperatively with the first lower board, the first connecting port, and the first fixing board; and a first fastening structure disposed at a side of the first case opposite to the first lateral board, the first fastening structure comprising a first base board connected to the first connecting port in a rotatable manner; and a first elastic fixing part connected to an end of the first base board for inserting into the hole of the first fixing board when the first base board rotates to a first position relative to the first connecting port so as to fix the first electronic device on the first lower board cooperatively with the first connecting port, the first fixing board, and the first lateral board.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
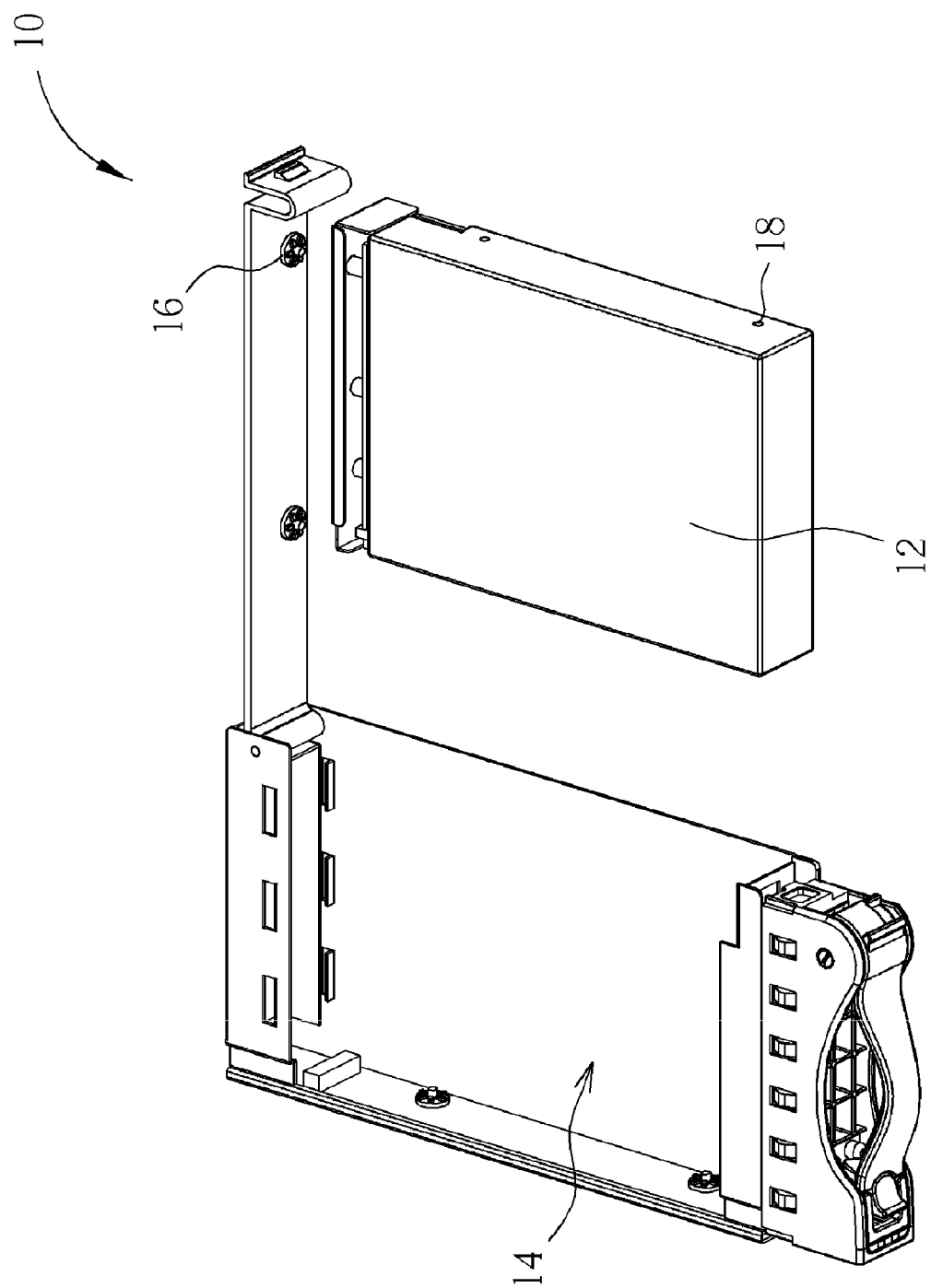
FIG. 1 is an exploded diagram of a holding module according to the first embodiment of the present invention.
Figure 2:
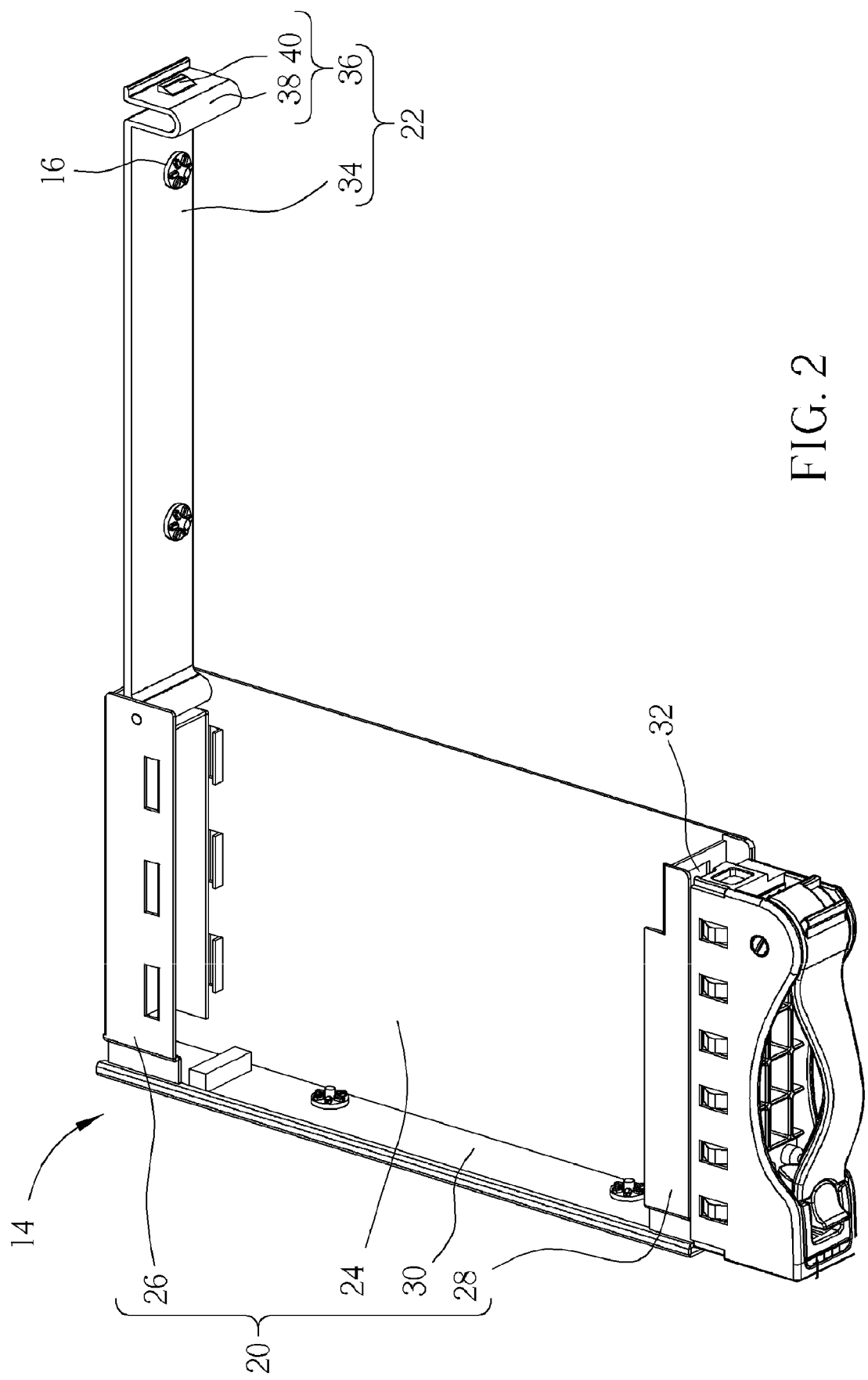
FIG. 2 is an enlarged diagram of the first assembly mechanism in FIG. 1.

Please refer to FIG. 1, which is an exploded diagram of a holding module 10 according to a first embodiment of the present invention. The holding module 10 comprises a first electronic device 12, a first assembly mechanism 14, and a fixing device 16. The first electronic device 12 has a fixing hole 18. The first electronic device 12 may be a storage device, such as a hard disk drive. The first assembly mechanism 14 is used for fixing the first electronic device 12. Next, please refer to FIG. 2, which is an enlarged diagram of the first assembly mechanism 14 in FIG. 1. As shown in FIG. 2, the first assembly mechanism 14 comprises a first case 20 and a first fastening structure 22. The first case 20 comprises a first lower board 24, a first connecting port 26, a first fixing board 28, and a first lateral board 30. The first lower board 24 is used for holding the first electronic device 12. The first connecting port 26 is connected to an end of the first lower board 24. The first connecting port 26 is electrically connected to the first electronic device 12 for transmitting data stored in the first electronic device 12. The first fixing board 28 is connected to an end of the first lower board 24 opposite to the first connecting port 26. A hole 32 is formed on the first fixing board 28. The first lateral board 30 is connected to the first lower board 24, the first connecting port 26, and the first fixing board 28. The lateral board 30 is used for containing the first electronic device 12 cooperatively with the first lower board 24, the first connecting port 26, and the first fixing board 28. The first fastening structure 22 is disposed at a side of the first case 20 in a rotatable manner (such as being pivotally connected to the first case 20). The first fastening structure 20 comprises a first base board 34 and a first elastic fixing part 36. The first base board 34 is connected to the first connecting port 26 in a rotatable manner. The first elastic fixing part 36 is connected to an end of the first base board 34. The first base board 34 and the first elastic fixing part 36 may be formed monolithically, or be formed independently. As shown in FIG. 2, the first elastic fixing part 36 comprises a U-shaped elastic piece 38 and an engaging piece 40. The engaging piece 40 is connected to a side of the U-shaped elastic piece 38. The engaging piece 40 and the U-shaped elastic piece 38 may be formed monolithically, or be formed independently. The engaging piece 40 is used for engaging with the hole 32 of the first fixing board 28. Thus, the first elastic fixing part 36 may fix the first electronic device 12 on the first lower board 24 cooperatively with the first connecting port 26, the first fixing board 28, the first lateral board 30, and the first base board 34. The fixing device 16 is used for inserting into the fixing hole 18 of the first electronic device 12.

Figure 3:
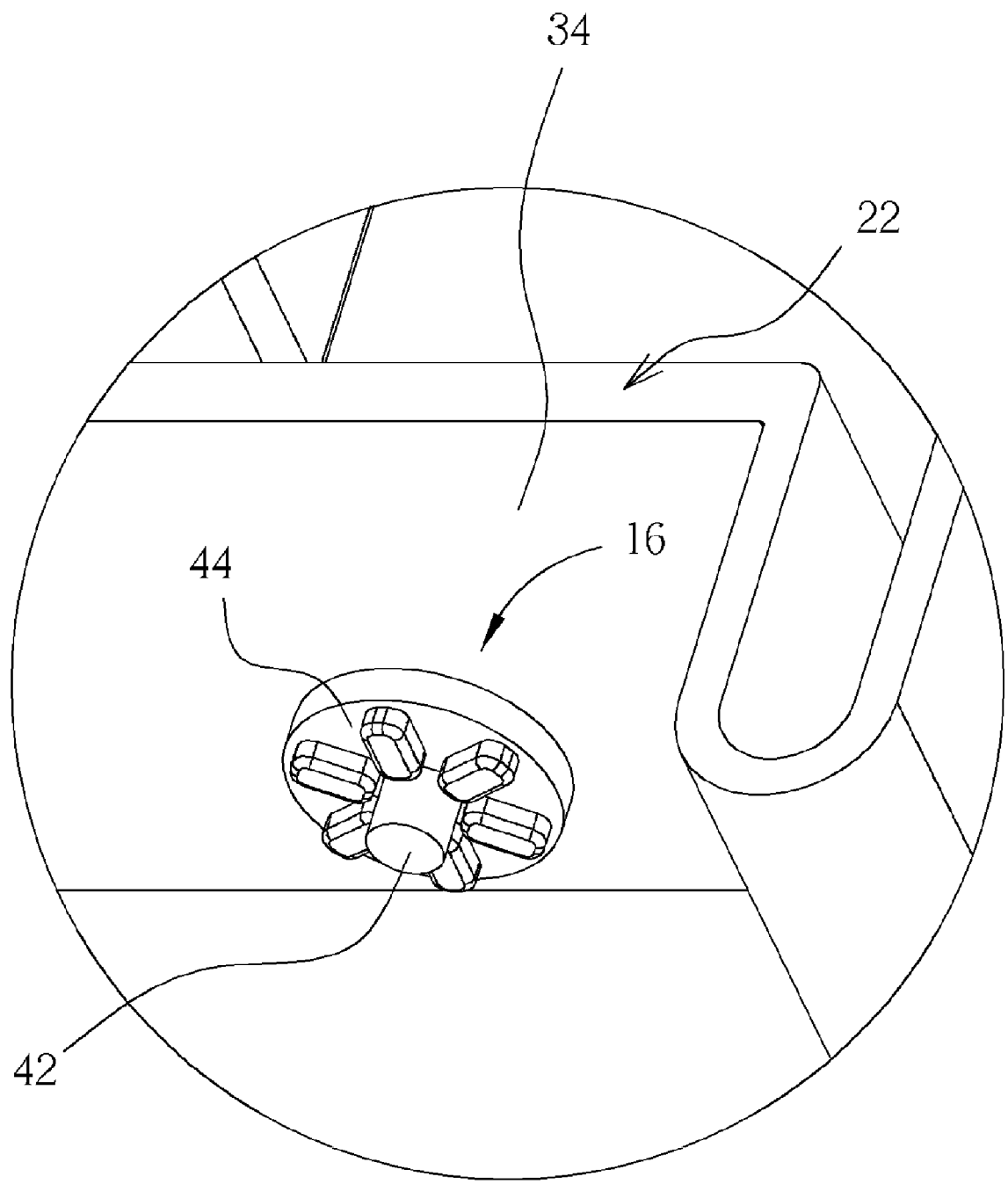
FIG. 3 is an enlarged diagram of the fixing device in FIG. 1.

More detailed description for the fixing device 16 is provided as follows. Please refer to FIG. 3, which is an enlarged diagram of the fixing device 16 in FIG. 1. As shown in FIG. 3, the fixing device 16 comprises a pin 42 and a flexible pad 44. The pin 42 is disposed on the first base board 34 of the first fastening structure 22. The pin 42 is used for inserting into the fixing hole 18 of the first electronic device 12 to provide the first electronic device 12 with an axial fixing force. The pin 42 is preferably made of metal material. The flexible pad 44 is disposed through the pin 42. The flexible pad 44 is preferably made of rubber material. The flexible pad 44 is used for absorbing vibrations generated from the first electronic device 12 while the first electronic device 12 is running.

Figure 4:
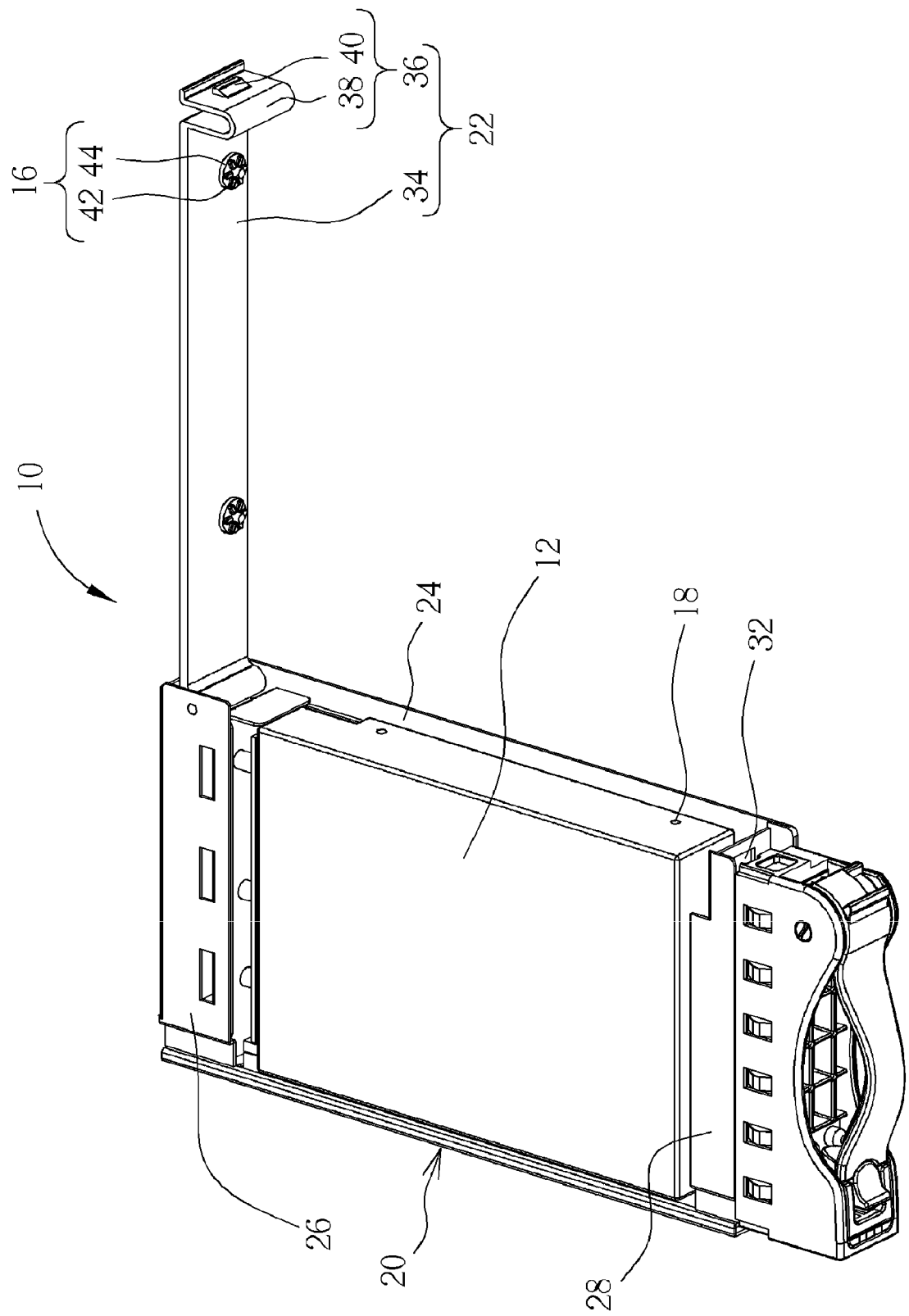
FIG. 4 is a diagram of the first electronic device in FIG. 1 being installed in the first case.
Figure 5:
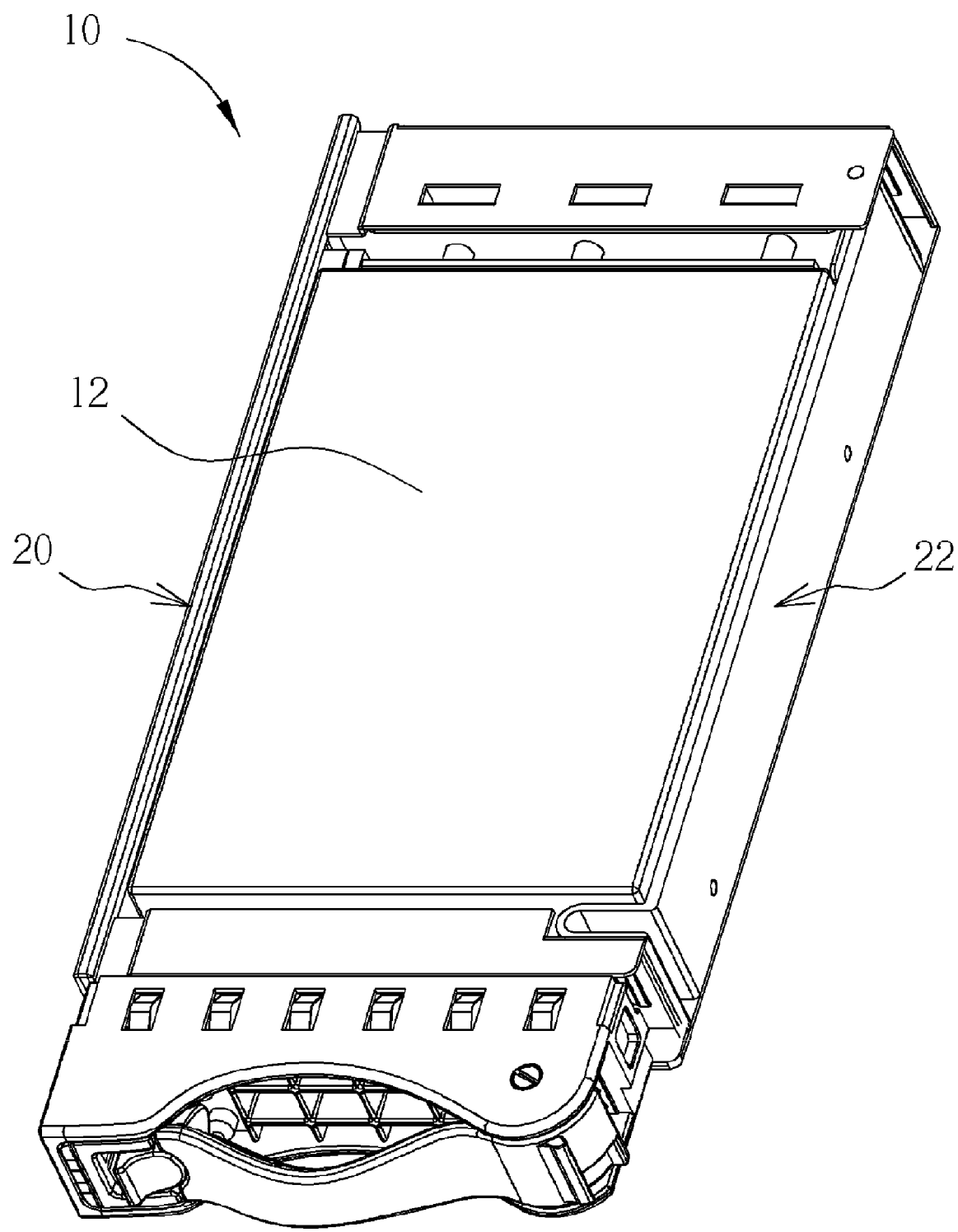
FIG. 5 is a diagram of the first fastening structure in FIG. 4 fixing the first electronic device in the first case.

Next, more detailed description for assembly and disassembly of the holding module 10 is provided as follows. Please refer to FIG. 1, FIG. 4, and FIG. 5. FIG. 4 is a diagram of the first electronic device 12 in FIG. 1 being installed in the first case 20. FIG. 5 is a diagram of the first fastening structure 22 in FIG. 4 fixing the first electronic device 12 in the first case 20. When a user wants to install the first electronic device 12 in the first case 20, the user needs to dispose the first electronic device 12 on the first lower board 24 of the first case 20 and make the first electronic device 12 be electrically connected to the first connecting port 26 (as shown in FIG. 4). Subsequently, when the user rotates the first base board 34 of the first fastening structure 22 to a position shown in FIG. 5 relative to the first connecting port 26 in a direction approaching the first fixing board 28, the user may exert force on the first elastic fixing part 36 to insert the engaging piece 40 on the first elastic fixing part 36 into the hole 32 of the first fixing board 28. At the same time, the pin 42 of the fixing device 16 disposed on the first base board 34 may also insert into the fixing hole 18 of the first electronic device 12. Thus, the holding module 10 may utilize the engagement of the engaging piece 40 and the hole 32 to containing the first electronic device 12 in the first case 20 and utilize the axial engagement of the pin 42 and the fixing hole 18 to fix the first electronic device 12 on the first lower board 24 of the first case 20, thereby finishing the assembly process of the holding module 10. On the other hand, if the user wants to detach the first electronic device 12 from the first case 20, the user just needs to pull the U-shaped elastic piece 38 to make the engaging piece 40 separate from the hole 32. After the engaging piece 40 is separated from the hole 32 completely, the user may need to push the first base board 34 of the first fastening structure 22 to rotate to a position shown in FIG. 4 relative to the first connecting port 26 in a direction away from the first fixing board 28. Finally, after the first electronic device 12 is disconnected from the first connecting port 26, the user may detach the first electronic device 12 from the first case 20 and then finish the disassembly process of the holding module 10.

It should be mentioned that the said fixing device 16 may be an optional device. That is to say, the holding module 10 may utilize the fixing device 16 to make disposal of the first electronic device 12 in the first case 20 more firm; or choose not to dispose the fixing device 16 on the first assembly mechanism 14, meaning that the holding module 10 may simply utilize the engagement of the engaging piece 40 and the hole 32 to fix the first electronic device 12 on the first lower board 24 of the first case 20 so that the manufacturing cost of the holding module 10 may be reduced. For example, as shown in FIG. 1, the number of the fixing device 16 on the holding module 10 may be added up to four. That is to say, four fixing devices 16 may be disposed between the first base board 34 of the first fastening structure 22 and the first lateral board 30 of the first case 20 respectively, and four fixing holes 18 may also be formed on two sides of the first electronic device 12 correspondingly. Thus, the pins 42 of the fixing devices 16 disposed on the first lateral board 30 may insert into the corresponding fixing holes 18 on the first electronic device 12 when the first electronic device 12 is disposed on the first lower board 24 of the first case 20, and the pins 42 of the fixing devices 16 disposed on the first base board 34 of the first fastening structure 22 may insert into the corresponding fixing holes 18 on the first electronic device 12 when the engaging piece 40 of the first elastic fixing part 36 is engaged with the hole 32 of the first fixing board 28. In such a manner, the first electronic device 12 may be disposed in the first assembly mechanism 14 more firmly. Furthermore, the holding module 10 may utilize the flexible pad 44 of the fixing device 16 to reduce vibrations generated from the first electronic device 12 when the first electronic device 12 is running inside the first assembly mechanism 14.

Figure 6:
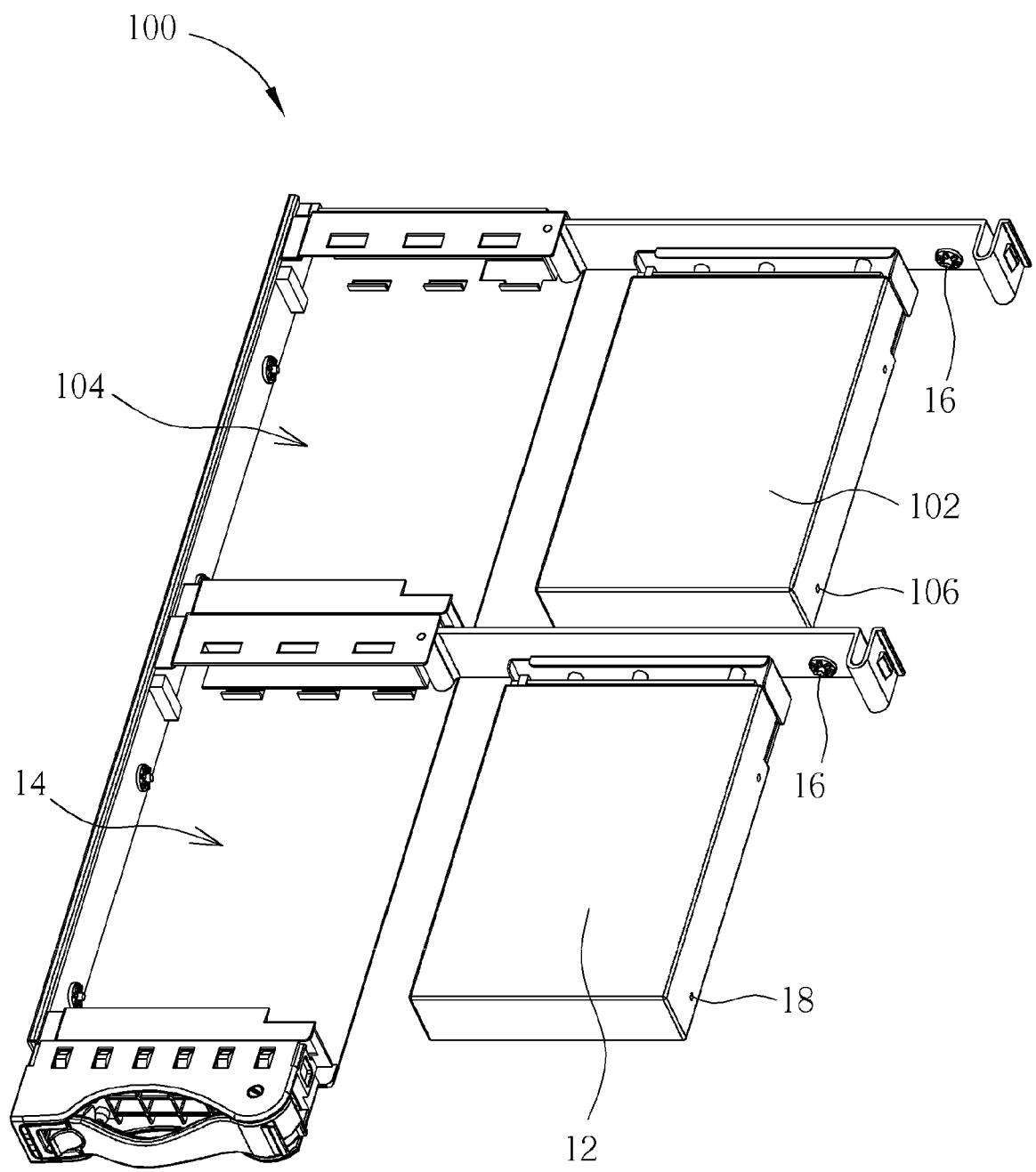
FIG. 6 is an exploded diagram of a holding module according to the second embodiment of the present invention.
Figure 7:
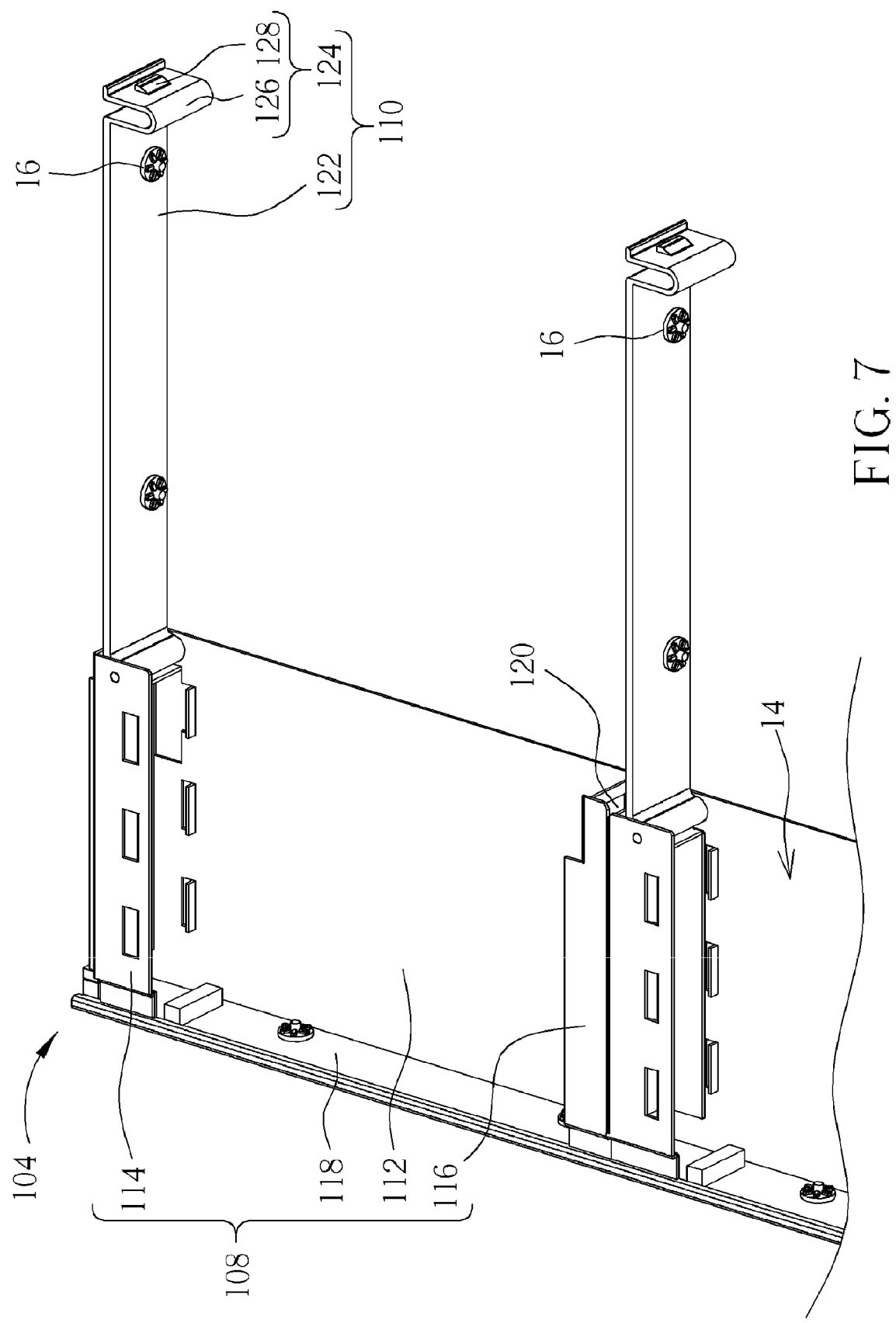
FIG. 7 is an enlarged diagram of the second assembly mechanism in FIG. 6.

Next, please refer to FIG. 6, which is an exploded diagram of a holding module 100 according to a second embodiment of the present invention. Components mentioned in both the first embodiment and the second embodiment represent components with similar functions or similar positions. The difference between the holding module 100 and the holding module 10 in FIG. 1 is additional disposal of the assembly mechanism. The holding module 100 comprises the first electronic device 12, the first assembly mechanism 14, the fixing device 16, a second electronic device 102, and a second assembly mechanism 104. The second electronic device 102 has a fixing hole 106. The second electronic device 102 may be a storage device, such as a hard disk drive. The second assembly mechanism 104 is used for fixing the second electronic device 102. Next, please refer to FIG. 7, which is an enlarged diagram of the second assembly mechanism 104 in FIG. 6. As shown in FIG. 7, the second assembly mechanism 104 is disposed at a side of the first assembly mechanism 14. The second assembly mechanism 104 comprises a second case 108 and a second fastening structure 110. The second case 108 comprises a second lower board 112, a second connecting port 114, a second fixing board 116, and a second lateral board 118. The second lower board 112 is used for holding the second electronic device 102. The second connecting port 114 is connected to an end of the second lower board 112. The second connecting port 114 is electrically connected to the second electronic device 102 for transmitting data stored in the second electronic device 102. The second fixing board 116 is connected to an end of the second lower board 112 opposite to the second connecting port 114. A hole 120 is formed on the second fixing board 116. The second lateral board 118 is connected to the second lower board 112, the second connecting port 114, and the second fixing board 116. The lateral board 118 is used for containing the second electronic device 102 cooperatively with the second lower board 112, the second connecting port 114, and the second fixing board 116. The second fastening structure 110 is disposed at a side of the second case 108 in a rotatable manner (such as being pivotally connected to the second case 108). The second fastening structure 110 comprises a second base board 122 and a second elastic fixing part 124. The second base board 122 is connected to the second connecting port 114 in a rotatable manner. The second elastic fixing part 124 is connected to an end of the second base board 122. The second base board 122 and the second elastic fixing part 124 may be formed monolithically, or be formed independently. As shown in FIG. 7, the second elastic fixing part 124 comprises a U-shaped elastic piece 126 and an engaging piece 128. The engaging piece 128 is connected to a side of the U-shaped elastic piece 126. The engaging piece 128 and the U-shaped elastic piece 126 may be formed monolithically, or be formed independently. The engaging piece 128 is used for engaging the hole 120 of the second fixing board 116. Thus, the second elastic fixing part 124 may fix the second electronic device 102 on the second lower board 112 cooperatively with the second connecting port 114, the second fixing board 116, the second lateral board 118, and the second base board 122. The fixing device 16 is used for inserting into the fixing hole 18 of the first electronic device 12 and the fixing hole 106 of the second electronic device 102.

Figure 8:
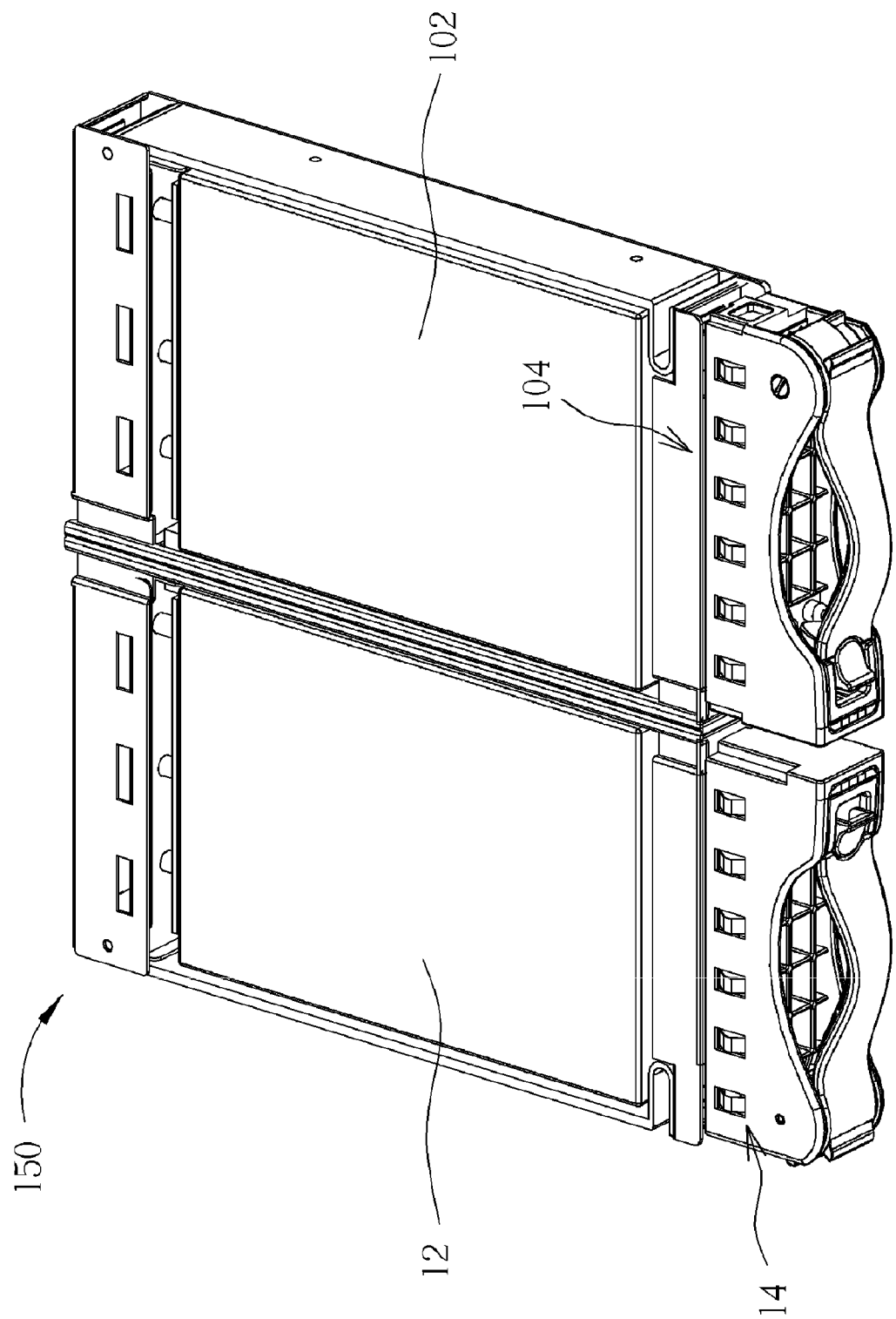
FIG. 8 is an assembly diagram of a holding module according to the third embodiment of the present invention.
Figure 9:
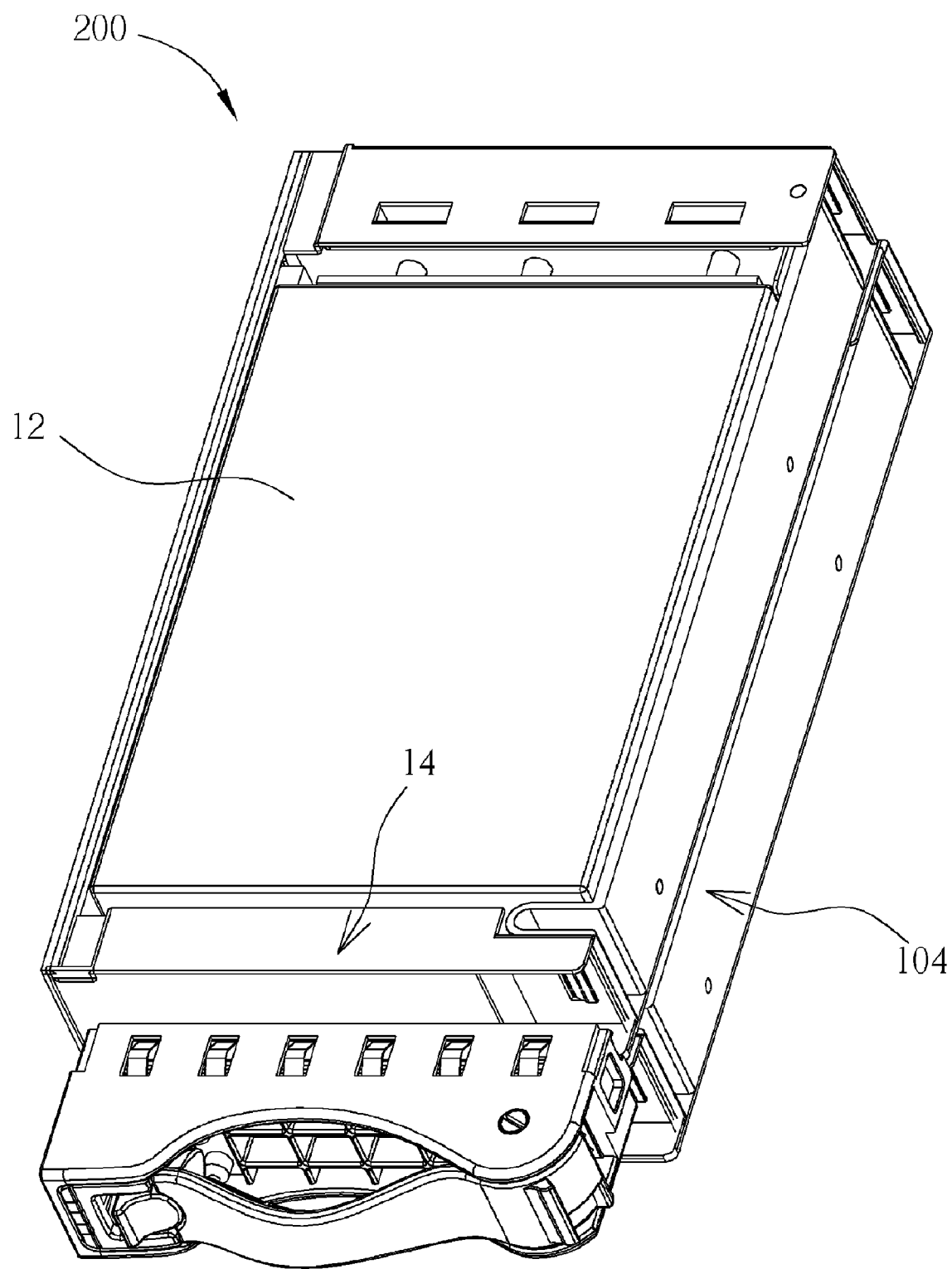
FIG. 9 is an assembly diagram of a holding module according to the fourth embodiment of the present invention.

Since the related assembly and disassembly processes of the holding module 100 in the second embodiment is similar to the assembly and disassembly processes of the holding module 10 mentioned in the first embodiment, the related description for the holding module 100 is omitted herein. Furthermore, disposal of the first assembly mechanism 14 and the second assembly mechanism 104 is not limited to the configuration shown in FIG. 6. For example, the second assembly mechanism 104 may also be disposed at a position shown in FIG. 8 or FIG. 9, meaning that each assembly mechanism in the present invention may be disposed in an array manner or in a stacking manner. In addition, all the configuration principles of the fixing device mentioned above may be applied to the embodiments shown in FIG. 6, FIG. 8, and FIG. 9.

Compared with the prior art fixing an electronic device via screws, the holding module according to the present invention utilizes the engagement of the engaging piece on the fastening structure and the hole on the case and the engagement of the pin on the fixing device and the fixing hole on the electronic device to fix the electronic device on the assembly mechanism. Thus, time needed for assembling the electronic device to the case may be reduced correspondingly. Furthermore, the holding module of the present invention may have a plurality of assembly mechanisms for containing a plurality of electronic devices. Therefore, the holding module of the present invention may be applied to a computer server, in which a plurality of hard disk drives is disposed.

Those skilled in the art will readily observe that numerous modifications and alterations of the device and method may be made while retaining the teachings of the invention.

What is claimed is:

1. An assembly mechanism capable of assembling an electronic device quickly comprising:
   a case comprising:
      a lower board for holding an electronic device;
      a connecting port connected to an end of the lower board and electrically connected to the electronic device;
      a fixing board connected to an end of the lower board opposite to the connecting port, a hole being formed on the fixing board; and
      a lateral board connected to the lower board, the connecting port, and the fixing board for containing the electronic device cooperatively with the lower board, the connecting port, and the fixing board; and
   a fastening structure disposed at a side of the case opposite to the lateral board, the fastening structure comprising:
      a base board connected to the connecting port in a rotatable manner; and
      an elastic fixing part connected to an end of the base board for inserting into the hole of the fixing board when the base board rotates to a first position relative to the connecting port so as to fix the electronic device on the lower board cooperatively with the connecting port, the fixing board, and the lateral board.

2. The assembly mechanism of claim 1 further comprising:
   at least one fixing device for inserting into a fixing hole on the electronic device to fix the electronic device on the lower board.

3. The assembly mechanism of claim 2, wherein the fixing device comprises:
   a pin disposed on the base board of the fastening structure for inserting into the fixing hole of the electronic device when the base board rotates to the first position relative to the connecting port; and
   a flexible pad disposed through the pin.

4. The assembly mechanism of claim 2, wherein the fixing device comprises:
   a pin disposed on the lateral board of the case for inserting into the fixing hole of the electronic device when the electronic device is disposed on the lower board; and
   a flexible pad disposed through the pin.

5. The assembly mechanism of claim 1, wherein the elastic fixing part comprises:
   a U-shaped elastic piece; and
      an engaging piece connected to a side of the U-shaped elastic piece for engaging with the hole.

6. A holding module capable of assembling an electronic device quickly, the holding module comprising:
   a first electronic device having at least one fixing hole; and
      a first assembly mechanism for fixing the first electronic device, the first assembly mechanism comprising:
         a first case comprising:
            a first lower board for holding the first electronic device;
            a first connecting port connected to an end of the first lower board and electrically connected to the first electronic device;
            a first fixing board connected to an end of the first lower board opposite to the first connecting port, a hole being formed on the first fixing board; and
            a first lateral board connected to the first lower board, the first connecting port, and the first fixing board, the first lateral board being used for containing the first electronic device cooperatively with the first lower board, the first connecting port, and the first fixing board; and a first fastening structure disposed at a side of the first case opposite to the first lateral board, the first fastening structure comprising:
  a first base board connected to the first connecting port in a rotatable manner; and
  a first elastic fixing part connected to an end of the first base board for inserting into the hole of the first fixing board when the first base board rotates to a first position relative to the first connecting port so as to fix the first electronic device on the first lower board cooperatively with the first connecting port, the first fixing board, and the first lateral board.

7. The holding module of claim 6 further comprising:
at least one fixing device for inserting into the fixing hole on the first electronic device to fix the first electronic device on the first lower board.

8. The holding module of claim 7, wherein the fixing device comprises:
  a pin disposed on the first base board of the first fastening structure for inserting into the fixing hole of the first electronic device when the first base board rotates to the first position relative to the first connecting port; and
  a flexible pad disposed through the pin.

9. The holding module of claim 7, wherein the fixing device comprises:
  a pin disposed on the first lateral board of the first case for inserting into the fixing hole of the first electronic device when the first electronic device is disposed on the first lower board; and
  a flexible pad disposed through the pin.

10. The holding module of claim 6, wherein the first flexible fixing part comprises:
  a U-shaped flexible piece; and
    an engaging piece connected to a side of the U-shaped flexible piece for engaging with the hole of the first fixing board.

11. The holding module of claim 6 further comprising:
a second electronic device having at least one fixing hole; and
a second assembly mechanism for fixing the second electronic device, the second assembly mechanism comprising:
  a second case comprising:
    a second lower board for holding the second electronic device;
    a second connecting port connected to an end of the second lower board for electrically connecting to the second electronic device;
    a second fixing board connected to an end of the second lower board opposite to the second connecting port, a hole being formed on the second fixing board; and
    a second lateral board connected to the second lower board, the second connecting port, and the second fixing board, for containing the second electronic device cooperatively with the second lower board, the second connecting port, and the second fixing board; and
  a second fastening structure disposed at a side of the second case opposite to the second lateral board, the second fastening structure comprising:
    a second base board connected to the second connecting port in a rotatable manner; and
    a second elastic fixing part connected to an end of the second base board for inserting into the hole of the second fixing board when the second base board rotates to a second position relative to the second connecting port so as to fix the second electronic device on the second lower board cooperatively with the second connecting port, the second fixing board, and the second lateral board.

12. The holding module of claim 11 further comprising:
at least one fixing device for inserting into the fixing hole on the second electronic device to fix the second electronic device on the second lower board.

13. The holding module of claim 12, wherein the fixing device comprises:
  a pin disposed on the second base board of the second fastening structure for inserting into the fixing hole of the second electronic device when the second base board rotates to the second position relative to the second connecting port; and
  a flexible pad disposed through the pin.

14. The holding module of claim 12, wherein the fixing device comprises:
  a pin disposed on the second lateral board of the second case for inserting into the fixing hole of the second electronic device when the second electronic device is disposed on the second lower board; and
  a flexible pad disposed through the pin.

15. The holding module of claim 11, wherein the second elastic fixing part comprises:
  a U-shaped elastic piece; and
    an engaging piece connected to a side of the U-shaped elastic piece for engaging with the hole of the second fixing board.

* * * * *